United States Patent [19]

Ott

[11] Patent Number: 5,130,644

[45] Date of Patent: Jul. 14, 1992

[54] INTEGRATED CIRCUIT SELF-TESTING DEVICE AND METHOD

[75] Inventor: Granville E. Ott, Richardson, Tex.

[73] Assignee: Texas Instruments Incorporated, Dallas, Tex.

[21] Appl. No.: 648,329

[22] Filed: Jan. 29, 1991

Related U.S. Application Data

[63] Continuation of Ser. No. 276,179, Nov. 23, 1988, abandoned.

[51] Int. Cl.⁵ .......................... G01R 1/00; G01R 1/02
[52] U.S. Cl. .................. 324/58 F; 324/158 P; 324/158 R; 437/8
[58] Field of Search ............... 324/158 P, 158 F, 501, 324/158 D, 158 R; 437/8; 250/341

[56] References Cited

U.S. PATENT DOCUMENTS

| | | | |
|---|---|---|---|
| 3,350,702 | 10/1967 | Herman | 324/501 |
| 3,463,007 | 8/1969 | Jones et al. | 324/501 |
| 3,641,972 | 2/1972 | Hostetter | 324/158 P |
| 3,801,905 | 4/1974 | Baker et al. | 324/73 R |
| 3,849,872 | 11/1974 | Hubacher | 437/8 |
| 3,946,421 | 3/1976 | Hartsell et al. | 357/68 |
| 3,969,670 | 7/1976 | Wu | 324/158 R |
| 4,142,151 | 2/1979 | Hansen | 324/158 D |
| 4,394,647 | 7/1983 | Van Dine | 324/133 |
| 4,654,689 | 3/1987 | Fujii | 357/68 |
| 4,703,436 | 10/1987 | Varshney | 437/8 |
| 4,712,057 | 12/1987 | Pau | 324/158 P |
| 4,734,641 | 3/1988 | Byrd, Jr. et al. | 324/158 R |
| 4,799,009 | 1/1989 | Tada et al. | 324/158 F |
| 4,862,094 | 8/1989 | Wetzel | 324/512 |

FOREIGN PATENT DOCUMENTS

| | | | |
|---|---|---|---|
| 0007136 | 1/1982 | Japan | 437/8 |
| 0073954 | 5/1982 | Japan | 437/8 |
| 88/01060 | 2/1988 | PCT Int'l Appl. | 324/73 R |

OTHER PUBLICATIONS

"Troubleshooting: The Heat's On", by Stoddard, Electronics, Apr. 1967, pp. 105-110.
"Self-Test/Connection Technique for Wafer Scale Integration Memory", IBM Tech. Disc. Bull., vol. 28, #4, pp. 1733-1735, Sep. 1985.
"Chip Power Test Circuit" by Klein et al., vol. 22 #8A, Jan. 1980, IBM Tech. Disc. Bull.

Primary Examiner—Kenneth A. Wieder
Assistant Examiner—William J. Burns
Attorney, Agent, or Firm—Stanton C. Braden; Richard L. Donaldson; William E. Hiller

[57] ABSTRACT

A semiconductor wafer (26) may have all the integrated circuits (36) formed thereon simultaneously self-tested by the addition of a power circuit, a ground circuit and clock circuit. Lead lines are formed during metallization of the integrated circuits (36) on the wafer (26). The lead lines are interconnected to the integrated circuits (36) to form a power input, a ground input and a clock input on each integrated circuit (36). A test head (28) having a power probe (44), a ground probe (46) and clock probe (48) is attached to the power, ground and clock circuits on the semiconductor wafer (36). The integrated circuits (36) are simultaneously tested by the test head (28), and failed circuits are identified by an infrared detector (42).

28 Claims, 2 Drawing Sheets

INTEGRATED CIRCUIT SELF-TESTING DEVICE AND METHOD

This application is a continuation of application Ser. No. 07/276,179, filed Nov. 23, 1988, now abandoned.

TECHNICAL FIELD OF THE INVENTION

This invention relates in general to semiconductor testing devices, and in particular to an rated circuit self-testing device and method.

BACKGROUND OF THE INVENTION

Integrated circuits are becoming more complex because of the greater numbers of and additional complexity of circuitry to be tested. Additionally, semiconductor wafers are getting larger, with more integrated circuits on each wafer. It is important to test all the components of each integrated circuit on a wafer as early as possible in the manufacturing sequence to lower costs.

Currently, one common device for the testing of integrated circuits is a multiprobe. The multiprobe device has a plurality of pins corresponding to the input/output pads on the integrated circuit to be tested. The multiprobe is aligned over an individual integrated circuit and placed in contact therewith. The chip is then run through a test sequence to evaluate the circuit. The more complex the integrated circuit, the more input/output pads and the more pins are required to engage the pads. If an integrated circuit has only a few input/output pads, it is not particularly difficult to use a multiprobe. However, if an integrated circuit has as many as 300 input/output pads, the multiprobe becomes difficult to manufacture, difficult to maintain and difficult to use.

Not only can the multiprobe itself become unwieldy to use, but as the number of chips on a wafer increases, so does the time and expense to test the chips. Since it is necessary to test each chip individually using the multiprobe device, the testing procedures are approaching the point of becoming more expensive than the fabrication costs to build the device.

Additionally, the more sophisticated integrated circuits are designed to run faster. The multiprobe devices tend to have inductance higher than that of the bond wire on the chips. Thus, it has become more difficult to run the circuit at full speed. If the circuit cannot be run at full speed, an accurate and reliable test cannot be made. Thus, there is a need for a self-test device and method to test all the circuits on an entire semiconductor wafer simultaneously.

SUMMARY OF THE INVENTION

The present invention disclosed herein comprises a method and apparatus for simultaneously self-testing integrated circuits on a semiconductor wafer which substantially reduces or eliminates problems associated with prior testing devices. The present invention allows the simultaneous self-testing of all the integrated circuits on a semiconductor wafer without the necessity of using a complex and unwieldy multiprobe device.

In accordance with one aspect of the invention, a semiconductor wafer simultaneously self-tests the integrated circuits thereon. A power circuit is interconnected to a power input on each of the integrated circuits; a ground circuit is interconnected to a ground input on each of the integrated circuits; and a clock circuit is interconnected to a clock input on each of the integrated circuits. The power, ground and clock circuits comprise a plurality of lead lines extending between the integrated circuits on the wafer and are formed during a metallization thereof. The power, ground and clock circuits are individually bussed to allow input from a single point external source. Capacitors are formed between the lead lines of the power circuit and the lead lines of the ground circuit to avoid excessive power and ground noise.

In a further aspect of the present invention, a test head provides an external source of power, ground and clock to the semiconductor wafer. Probes are extended from a platform to contact the power, ground and clock busses on the semiconductor wafer to allow the appropriate input. An observation window is formed through the platform to allow optical detection of the passing or failing of the individual circuits.

It is a technical advantage of the present invention that it allows the simultaneous self-testing of all the integrated circuits on a semiconductor wafer. It is a further advantage of the present invention that the cost of testing the integrated circuits on a semiconductor wafer is greatly reduced.

BRIEF DESCRIPTION OF THE DRAWINGS

For a more complete understanding of the present invention and for further advantages thereof, reference is now made to the following Detailed Description, taken in conjunction with the accompanying Drawings in which.

DETAILED DESCRIPTION OF THE PRESENT INVENTION

Figure 1:
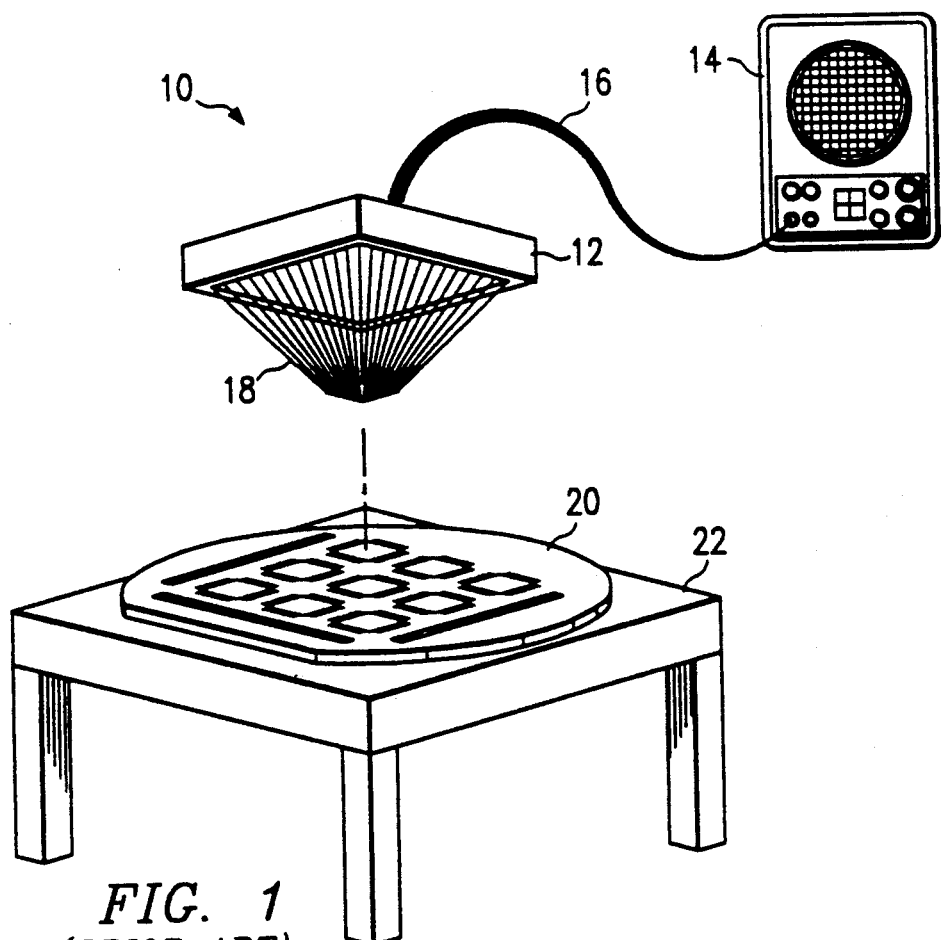
FIG. 1 is a perspective view of a multiprobe device constructed in accordance with the prior art.

Referring to FIG. 1, a multiprobe test device constructed in accordance with the prior art is generally identified by the reference numeral 10. The device 10 comprises a multiprobe test head 12 connected to a monitor scope 14 by a cable 16.

The head 12 has a plurality of needle-like probes 18 protruding therefrom. The number of probes 18 is dependent upon the number of input/output pads on the particular integrated circuit to be tested. For example, if there are 300 input/output pads on the integrated circuit to be tested, there must be 300 needle-like probes 18 on the test head 12.

A semiconductor wafer 20 is placed on a platform 22 to test the integrated circuits thereon. Using procedures well known in the art, the test head 12 is properly positioned over an individual integrated circuit (or chip) on the semiconductor wafer 20 and placed in contact therewith. The device 10 is then powered to test the integrated circuit, the results which may be viewed on the monitor scope 14. After one integrated circuit is tested by the device 10, the device 10 is moved and repositioned over the next integrated circuit to be tested.

Thus, if there are nine integrated circuits on the semiconductor wafer 20, there will be a total of nine separate tests run thereon. The more complex the integrated circuits become, the more needle-like probes 18 are required. Additionally, the more integrated circuits on the wafer 20, the more individual tests there are to perform. Obviously, a large semiconductor wafer with a large number of integrated circuits thereon will take a corresponding amount of time to test.

Figure 2:
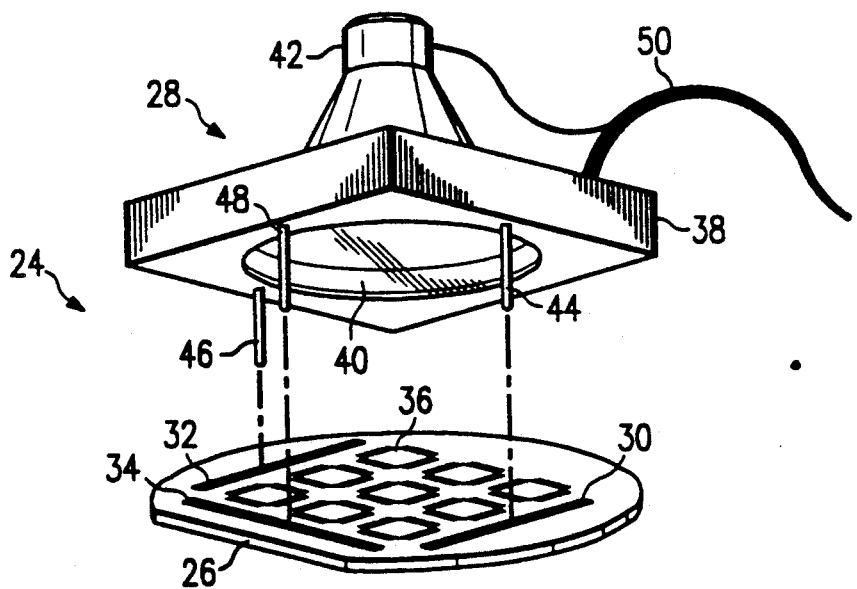
FIG. 2 is a perspective view of a preferred embodiment of the present invention.

Referring to FIG. 2, a device in accordance with the present invention for simultaneously self-testing a plurality of integrated circuits on a semiconductor wafer is generally identified by the reference numeral 24. The device 24 comprises an improved wafer 26 and a test head 28. The improved wafer 26 comprises a power bus 30, a ground bus 32 and a clock bus 34, each of which are individually connected by lead lines to the integrated circuits 36 on the wafer 26, as will subsequently be described in greater detail.

The test head 28 comprises a platform 38 with an observation window 40 passing therethrough. The window 40 may comprise, for example, a germanium infrared lens. Integral with the infrared lens of the window 40, there may also be a wide angle lens or a scanner device to either view all the circuits simultaneously or sequentially, as desired. Optically connected to the window 40 is an infrared detector 42. Protruding from the platform 38 are a power probe 44, a ground probe 46 and a clock probe 48, each of which are interconnected to an external source by a cable 50. For example only, a 3-5 volt DC power source may be used.

In operation, the test head 28 is positioned over the semiconductor wafer 26 to align the power probe 44 with the power bus 30, the ground probe 46 with the ground bus 32, and the clock probe 48 with the clock bus 34. Power, ground and clock voltages are then supplied to the wafer 26 via the test head 28 to run all of the integrated circuits 36 through a test cycle. The infrared detector 42 will identify any failed integrated circuits on the semiconductor wafer 26, which may then be either mapped or marked for removal at a later time.

Figure 3:
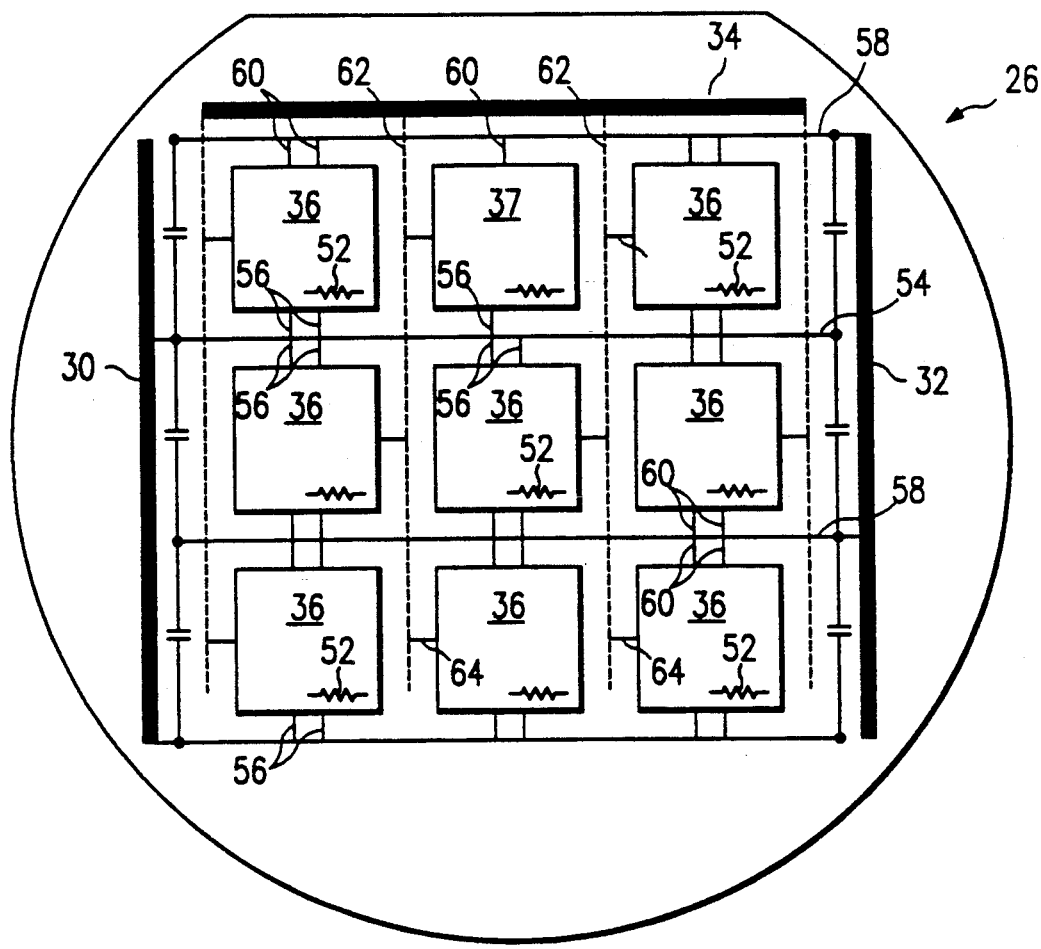
FIG. 3. is a plan view of a semiconductor wafer constructed in accordance with the preferred embodiment of the present invention.

Referring to FIG. 3, an improved semiconductor wafer 26 is shown in plan view. The wafer 26 has a power bus 30, a ground bus 32 and a clock bus 34 formed thereon. For example only, the wafer 26 is provided with eight integrated circuits 36 and one integrated circuit 37. During the integrated circuit processing, a grounded device such as a resistor 52 is formed into a portion of each integrated circuit 36 and 37. The resistor 52 is connected to the output of a latch to allow the creation of a hot spot which may be either turned on or turned off to indicate a failure within each individual integrated circuit 36 or 37. The resistor 52 may then be detected by an infrared detector to determine which circuits have passed or failed the test.

Extending from the power bus 30 is a power circuit comprised of a plurality of lead lines 54. The lead lines 54 contact at least one power input 56 on the integrated circuits 36 and 37. Extending from the ground bus 32 is a ground circuit comprising a plurality of lead lines 58 which contact at least one ground input 60 on each of the integrated circuits 36 and 37. Extending from the clock bus 34 is a clock circuit comprising a plurality of lead lines 62, which contact each of the integrated circuits 36 and 37 at a clock input 64.

Each of the lead lines 54, 58 and 62 are formed between the integrated circuits 36 and 37 during a metallization of the wafer 26. It is preferable to form the lead lines 54, 58 and 62 during the final two metallization steps in the processing of the wafer 26. Since the lead lines 62 (clock) cross the lead lines 54 (power) and the lead lines 58 (ground), it would be preferable to form the lead lines 62 in a separate metallization layer from the formation of lead lines 54 and 58, with a layer of insulation therebetween. Lead lines 54, 58 and 62 are patterned and etched, using techniques well known in the art, to fit between the integrated circuits 36 and 37 such that, when the wafer 26 is sawed into individual chips, the lead lines 54, 58 and 62 are destroyed, as they are no longer needed.

As a precaution to avoid excessive power and ground noise, capacitors 66 may be formed on the wafer 26. The capacitors 66 are patterned and etched onto the wafer 26 between each power lead line 54 and each ground lead line 58.

Figure 4:
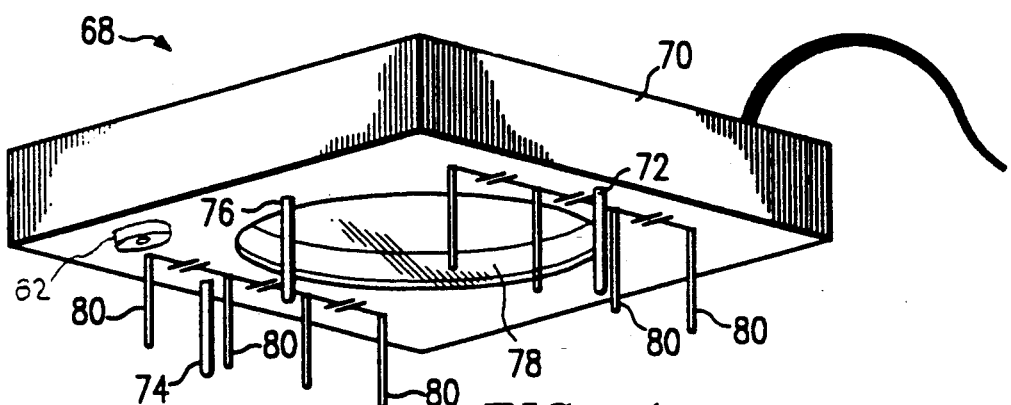
FIG. 4 is a perspective view of a test head constructed in accordance with an alternate embodiment of the present invention.

Referring to FIG. 4, an alternate embodiment of a test head is generally identified by the reference numeral 68. The test head 68 comprises a platform 70 having a power probe 72, a ground probe 74 and a clock probe 76 extending therefrom. An observation window 78 is formed in a central portion of the platform 70 to allow observation of the integrated circuits on a semiconductor wafer during testing thereof. A plurality of capacitor probes 80 extend from the platform 70 to contact power and ground lead lines on the semiconductor wafer to be tested. The capacitor probes 80 provide the needed capacitance to avoid excessive power and ground noise during the testing of the semiconductor wafer. A dye marker 82 may be movably attached to the platform 70. The dye marker 82 may be repositioned along platform 70 by any appropriate method (not shown) to mark an integrated circuit that has failed the test with a dye visible to the human eye. By marking failed integrated circuits, an operator may separate failed integrated circuits from those that have passed the test.

Thus a semiconductor wafer may have all the integrated circuits thereon simultaneously self-tested. The present invention allows the testing of an entire semiconductor wafer without use of the expensive and unwieldy multiprobe device. Failed circuits may be identified and marked for subsequent separation and destruction.

Although the present invention has been described with respect to a specific, preferred embodiment thereof, various changes and modifications may be suggested to one skilled in the art, and it is intended that the present invention encompass such changes and modifications as fall within the scope of the appended claims.

What is claimed is:

1. A method for forming a semiconductor wafer for simultaneously self testing integrated circuits thereon, comprising the steps of:

interconnecting a power circuit formed in a first metallization layer to a power input on the integrated circuits;

interconnecting a ground circuit formed in said first metallization layer to a ground input on the integrated circuits;

interconnecting a clock circuit formed in a second metallization layer to a clock input on the integrated circuits to allow the integrated circuits to be simultaneously tested; and interconnecting an infrared indicating circuit to optically indicate a test pass/fail condition for each integrated circuit.

2. The method of claim 1, wherein the step of interconnecting said power circuit comprises the steps of:
   forming a plurality of lead lines between the integrated circuits during a metallization of the wafer; and
   connecting said lines to form a bus for power input.

3. The method of claim 1, wherein the step of interconnecting said ground circuit comprises the steps of:
   forming a plurality of lead lines between the integrated circuits during a metallization of the wafer; and
   connecting said lines to form a bus for ground input.

4. The method of claim 1, wherein the step of interconnecting said clock circuit comprises the steps of:
   forming a plurality of lead lines between the integrated circuits during a metallization of the wafer; and
   connecting said lines to form a bus for clock input.

5. The method of claim 1, further comprising the step of connecting a plurality of capacitors between said power circuit and said ground circuit to avoid excessive power and ground noise.

6. The method of claim 1, further including the step of connecting an external source to said circuits to provide power, ground and clock.

7. The method of claim 1 and further comprising:
   testing the integrated circuits by applying selected voltages to said power, ground and clock circuits; and
   detecting selected characteristics of the integrated circuits in response to said selected voltages using said infrared indicating circuit.

8. A method for simultaneously self-testing a plurality of integrated circuits on a semiconductor wafer, comprising the steps of:
   forming a plurality of first lead lines on the wafer interconnected to at least one power input on the integrated circuits;
   forming a plurality of second lead lines on the wafer interconnected to at least one ground input on the integrated circuits, wherein said pluralities of first and second lead lines comprise a first metallization layer;
   forming a plurality of third lead lines on the wafer interconnected to a clock input on the integrated circuits, wherein said plurality of third lead lines comprise a second metallization layer;
   forming an insulator layer between said first and second metallization layers;
   providing power, ground and clock with a test head to said first, second and third lead lines to simultaneously self-test the integrated circuits on the wafer; and
   providing a detecting circuit to optically detect a test pass/fail condition for each integrated circuit.

9. The method of claim 8, wherein the steps of forming lead lines comprise:
   metallizing the wafer;
   patterning said lines; and
   etching said patterned lines.

10. A method for simultaneously self-testing a plurality of integrated circuits on a semiconductor wafer, comprising:
    a plurality of first lead lines formed on the wafer and interconnected to at least one power input on the integrated circuits;
    a plurality of second lead lines formed on the wafer and interconnected to at least one ground input on the integrated circuits;
    a plurality of third lead lines formed on the wafer and interconnected to a clock input on the integrated circuits, wherein said first and second lead lines comprise a second metallization layer, and said third lead line comprises a second metallization layer separated from said first metallization layer by an insulator; and
    a test head for providing power, ground and clock to said first, second and third lead lines to simultaneously self-test the integrated circuits on the wafer;
    wherein said test head further comprises an infrared detector.

11. The apparatus of claim 10, wherein each of said plurality of first lead lines are connected together to form a wafer power input bus.

12. The apparatus of claim 10, wherein each of said plurality of second lead lines are connected together to form a wafer power input bus.

13. The apparatus of claim 10, wherein each of said plurality of third lead lines are connected together to form a wafer power input bus.

14. The apparatus of claim 10, further including a plurality of capacitors interconnected between said first lines and said second lines to avoid excessive power and ground noise.

15. The apparatus of claim 10, wherein said test head comprises:
    a platform;
    a power probe on said platform;
    a ground probe on said platform; and
    a clock probe on said platform to allow said test head to be positioned over the wafer to test circuits thereon.

16. The apparatus of claim 15, further comprising an infrared lens interconnected to said infrared detector for observing the circuits during testing to locate failed circuits.

17. The apparatus of claim 16, further including a wide-angle lens to allow the plurality of the integrated circuits to be viewed simultaneously.

18. The apparatus of claim 16, further including a scanner device to sequentially view the plurality of integrated circuits.

19. The apparatus of claim 15, further including a plurality of capacitor probes capable of connection between said plurality of first lead lines and said plurality of second lead lines to avoid excessive power and ground noise.

20. The apparatus of claim 10, wherein said test head further includes a dye marker to mark failed circuits.

21. The apparatus of claim 16, further comprising a resistor on each of the circuits to indicate a test pass/fail condition.

22. A semiconductor wafer for enabling self-testing of integrated circuits thereon, comprising:
    a power circuit interconnected to a power input on the integrated circuits;
    a first probe for supplying power to said power circuit;
    a ground circuit interconnected to a ground input on the integrated circuits;
    a second probe for supplying power to said ground circuit;

a clock circuit interconnected to a clock input on the integrated circuits being operable to allow the integrated circuits to be simultaneously tested;

a third probe for supplying power to said clock circuit;

a plurality of capacitor probes insertable between said power circuit and said ground circuit to avoid excessive power and ground noise;

a means for holding said first, second, third, and capacitor probes to allow placement over a wafer to be tested; and an indicating circuit, wherein said circuit optically indicates a test pass/fail condition for each integrated circuit.

23. The wafer of claim 22 wherein said power circuit comprises:

a plurality of lead lines formed on the wafer during a metallization of the wafer extending between the integrated circuits; and a bus for allowing said lines to be powered by a single, external source.

24. The wafer of claim 22 wherein said ground circuit comprises:

a plurality of lead lines formed on the wafer during a metallization of the wafer extending between the integrated circuits; and a bus for allowing said lines to be grounded by a single, external source.

25. The wafer of claim 22 wherein said clock circuit comprises:

a plurality of lead lines formed on the wafer during a metallization of the wafer extending between the integrated circuits; and a bus for allowing said lines to be provided with clock data from a single, external source.

26. The wafer of claim 22, further including a plurality of capacitors connected between said power circuit and said ground circuit to avoid excessive power and ground noise.

27. The wafer of claim 22 wherein said means for holding comprises a platform.

28. The wafer of claim 27, wherein said platform further includes means for marking failed integrated circuits.

* * * * *